(12) United States Patent
Sung et al.

(10) Patent No.: US 11,309,400 B2
(45) Date of Patent: Apr. 19, 2022

(54) STACKED THIN FILM TRANSISTORS WITH NANOWIRES

(71) Applicant: INTEL CORPORATION, Santa Clara, CA (US)

(72) Inventors: Seung Hoon Sung, Portland, OR (US); Abhishek A. Sharma, Hillsboro, OR (US); Van H. Le, Portland, OR (US); Gilbert Dewey, Beaverton, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,153

(22) PCT Filed: Jan. 12, 2018

(86) PCT No.: PCT/US2018/013570
§ 371 (c)(1),
(2) Date: Mar. 24, 2020

(87) PCT Pub. No.: WO2019/139615
PCT Pub. Date: Jul. 18, 2019

(65) Prior Publication Data
US 2020/0227535 A1    Jul. 16, 2020

(51) Int. Cl.
*H01L 29/66* (2006.01)
*H01L 29/417* (2006.01)
(Continued)

(52) U.S. Cl.
CPC .... *H01L 29/66439* (2013.01); *H01L 27/1225* (2013.01); *H01L 29/0669* (2013.01);
(Continued)

(58) Field of Classification Search
CPC ........... H01L 29/66439; H01L 29/0669; H01L 29/41733; H01L 29/42392;
(Continued)

(56) References Cited

U.S. PATENT DOCUMENTS 9,853,114 B1   12/2017 Rodder et al.
2013/0240871 A1*  9/2013 Shimoda ................. B41J 2/161
257/43

(Continued)

FOREIGN PATENT DOCUMENTS

WO      2019139615 A1    7/2019

OTHER PUBLICATIONS

International Preliminary Report on Patentability dated Jul. 14, 2020 for International Patent Application PCT/US2018/013570, 9 pages.

(Continued)

*Primary Examiner* — Tong-Ho Kim
(74) *Attorney, Agent, or Firm* — Schwabe, Williamson & Wyatt, P.C.

(57) ABSTRACT

Thin film transistor structures and processes are disclosed that include stacked nanowire bodies to mitigate undesirable short channel effects, which can occur as gate lengths scale down to sub-100 nanometer (nm) dimensions, and to reduce external contact resistance. In an example embodiment, the disclosed structures employ a gate-all-around architecture, in which the gate stack (including a high-k dielectric layer) wraps around each of the stacked channel region nanowires (or nanoribbons) to provide improved electrostatic control. The resulting increased gate surface contact area also provides improved conduction. Additionally, these thin film structures can be stacked with relatively small spacing (e.g., 1 to 20 nm) between nanowire bodies to increase integrated circuit transistor density. In some embodiments, the nanow- (Continued)

ire body may have a thickness in the range of 1 to 20 nm and a length in the range of 5 to 100 nm.

20 Claims, 15 Drawing Sheets

(51) Int. Cl.
  *H01L 29/423* (2006.01)
  *H01L 27/12* (2006.01)
  *H01L 29/786* (2006.01)
  *H01L 29/06* (2006.01)

(52) U.S. Cl.
  CPC .. *H01L 29/41733* (2013.01); *H01L 29/42392* (2013.01); *H01L 29/66545* (2013.01); *H01L 29/7869* (2013.01); *H01L 29/78696* (2013.01)

(58) Field of Classification Search
  CPC ........... H01L 29/66545; H01L 29/7869; H01L 29/78696; H01L 27/1225
  USPC ....................................................... 257/288
  See application file for complete search history.

(56) References Cited

U.S. PATENT DOCUMENTS

| | | | |
|---|---|---|---|
| 2015/0228803 A1* | 8/2015 | Koezuka | H01L 27/1225 257/43 |
| 2017/0062603 A1* | 3/2017 | Suzuki | H01L 29/40114 |
| 2017/0154960 A1 | 6/2017 | Rachmady et al. | |
| 2017/0179248 A1 | 6/2017 | Pawlak | |
| 2017/0263707 A1 | 9/2017 | Krishnan et al. | |
| 2017/0271515 A1 | 9/2017 | Le et al. | |
| 2019/0131437 A1* | 5/2019 | Le | H01L 29/42392 |
| 2020/0127142 A1* | 4/2020 | Dewey | H01L 29/41791 |

OTHER PUBLICATIONS

International Search Report and Written Opinion received for PCT Application No. PCT/US2018/013570, dated Oct. 11, 2018. 13 pages.

* cited by examiner

STACKED THIN FILM TRANSISTORS WITH NANOWIRES

CROSS-REFERENCE TO RELATED APPLICATIONS

This patent application is a U.S. National Phase Application under 35 U.S.C. § 371 of International Application No. PCT/US2018/013570, filed on Jan. 12, 2018, the entire contents of which is hereby incorporated by reference herein.

BACKGROUND

A thin film transistor (TFT) is generally fabricated by depositing thin films of an active semiconductor layer as well as a dielectric layer and metallic contacts over a substrate. There are a number of non-trivial performance issues associated with TFTs.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1A:
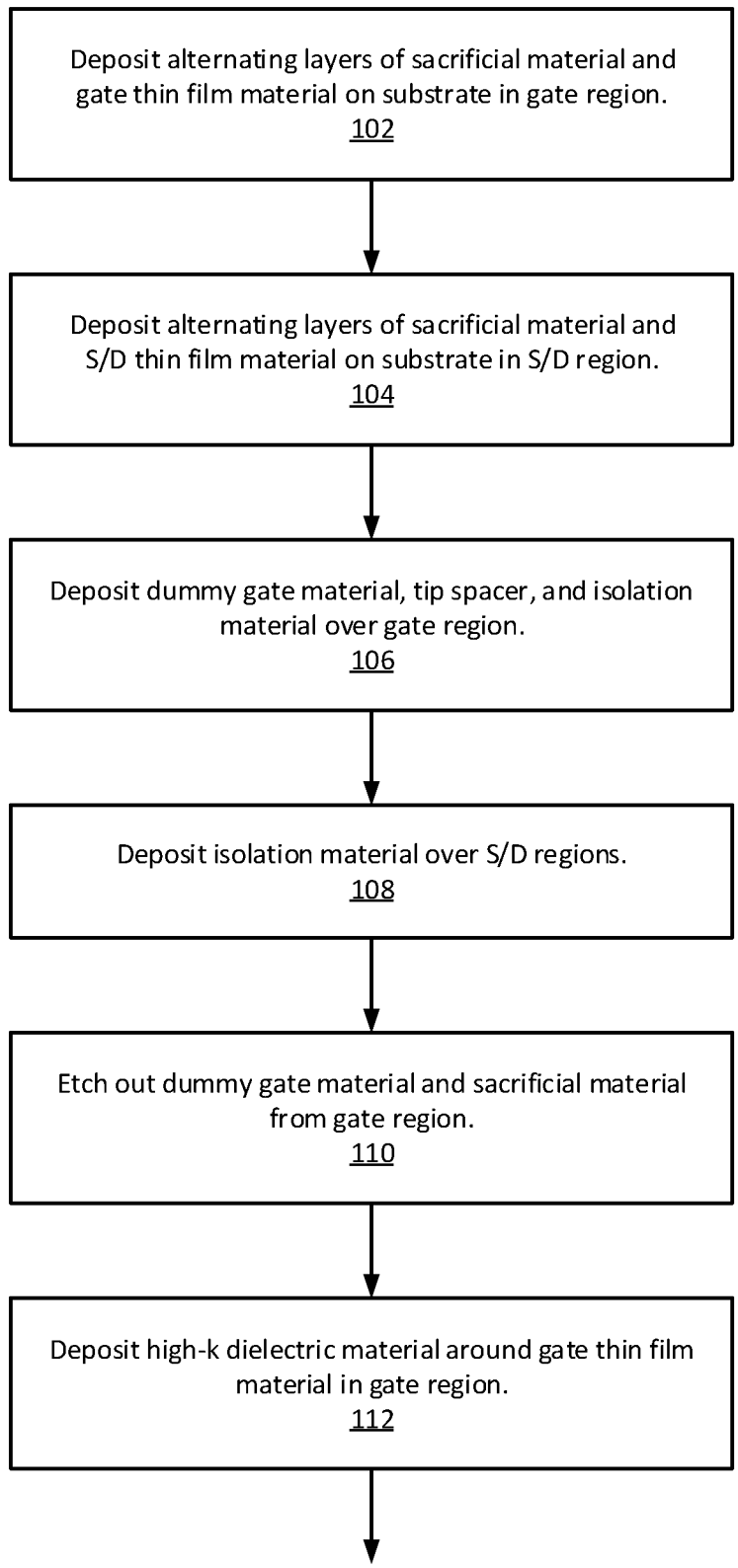
FIGS. 1A and 1B illustrate a method of forming an integrated circuit (IC) including stacked nanowire thin film transistors, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually differentiating the different features. In short, the figures are provided merely to show example structures Although the following Detailed Description will proceed with reference being made to illustrative embodiments, many alternatives, modifications, and variations thereof will be apparent in light of this disclosure.

DETAILED DESCRIPTION

Thin film transistor (TFT) structures, and processes for fabrication of those structures, are disclosed which include stacked nanowire bodies to mitigate undesirable short channel effects (SCE) and reduce external contact resistance (Rext). In an example embodiment, the disclosed structures employ a gate-all-around (GAA) architecture, in which the gate structure includes a high-k dielectric layer and a metal gate layer wrapped around each of the stacked nanowire bodies to provide improved electrostatic control. The resulting increased gate surface contact area also provides improved electrical conduction, as will be explained in greater detail below. Additionally, these thin film structures can be stacked with relatively small spacing between nanowire bodies (e.g., in the range of 1 to 20 nm) to increase transistor density on the integrated circuit. In some embodiments, the nanowire bodies may have a thickness in the range of 1 to 20 nm, and a length (e.g., between source and drain regions) in the range of 5 to 100 nm. In some embodiments, up to 10 or more nanowire bodies may be stacked to increase current handling capability of the TFT. Numerous configurations and process flows will be apparent in light of this disclosure.

General Overview

As transistor devices are scaled down to include smaller critical dimensions, and in particular, as gate lengths decrease below 100 nm (and especially below 50 nm), SCE problems can arise. These problems typically include, for example, increased current leakage from source to drain regions, reduced contact resistance which limits transistor current handling capacity, and degraded subthreshold swing characteristics (e.g., the ratio of gate-source voltage to drain-source current) which reduces switching speed.

Thus, and in accordance with numerous embodiments of the present disclosure, techniques are provided for forming TFT structures that include stacked nanowire bodies comprising the source, gate (or channel), and drain regions of the transistor. As can be understood based on this disclosure, a gate dielectric layer and a metal gate layer or so-called electrode wrap around each of the stacked nanowires (or nanoribbons) to provide improved electrostatic control and increased contact surface area for the gate, with the gate dielectric layer being between the metal gate layer and the corresponding nanowire body. In some embodiments, the nanowire body includes an oxide semiconductor material, such as indium gallium zinc oxide (IGZO), zinc oxide, indium oxide, aluminum zinc oxide, gallium oxide, indium zinc oxide, indium tin oxide, copper oxide, and/or zinc tin oxide. In some embodiments, the nanowire body may include group III-V semiconductor materials, such as indium gallium arsenide, and/or indium phosphide. In some embodiments, the nanowire body may include silicon, germanium, and/or silicon germanium. The gate dielectric may include a high-k gate dielectric material, in some embodiments.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C. Likewise, the expression "X included in at least one of A and B refers to an X that may be included, for example, in just A only, in just B only, or in both A and B. The above discussion with respect to "X includes at least one of A and B" equally applies here, as will be appreciated.

Use of the techniques and structures provided herein may be detectable using tools such as: photo-luminescence detection, electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit including stacked nanowire thin film transistors, as described herein.

In some embodiments, the techniques and structures described herein may be detected based on the benefits derived therefrom, such as by observing a thin film transistor structure with sub-100 nm gate length that does not exhibit undesirable short channel effects and high external contact resistance. Numerous configurations and variations will be apparent in light of this disclosure.

Methodology and Architecture

FIG. 1 (1A and 1B) illustrate method 100 of forming an integrated circuit (IC) including stacked nanowire thin film transistors, in accordance with some embodiments of the present disclosure. FIGS. 2 through 13 illustrate example IC structures that are formed when carrying out method 100 of FIG. 1, in accordance with some embodiments. The structures of FIGS. 2-13 are depicted and described herein as comprising a stack of two TFT layers, for ease of illustration. However, in some embodiments, the disclosed techniques can be used to form a TFT stack of any desired number of layers, for example up to 10 layers or more, as can be understood based on this disclosure. Numerous variations and configurations will be apparent in light of this disclosure.

Figure 2:
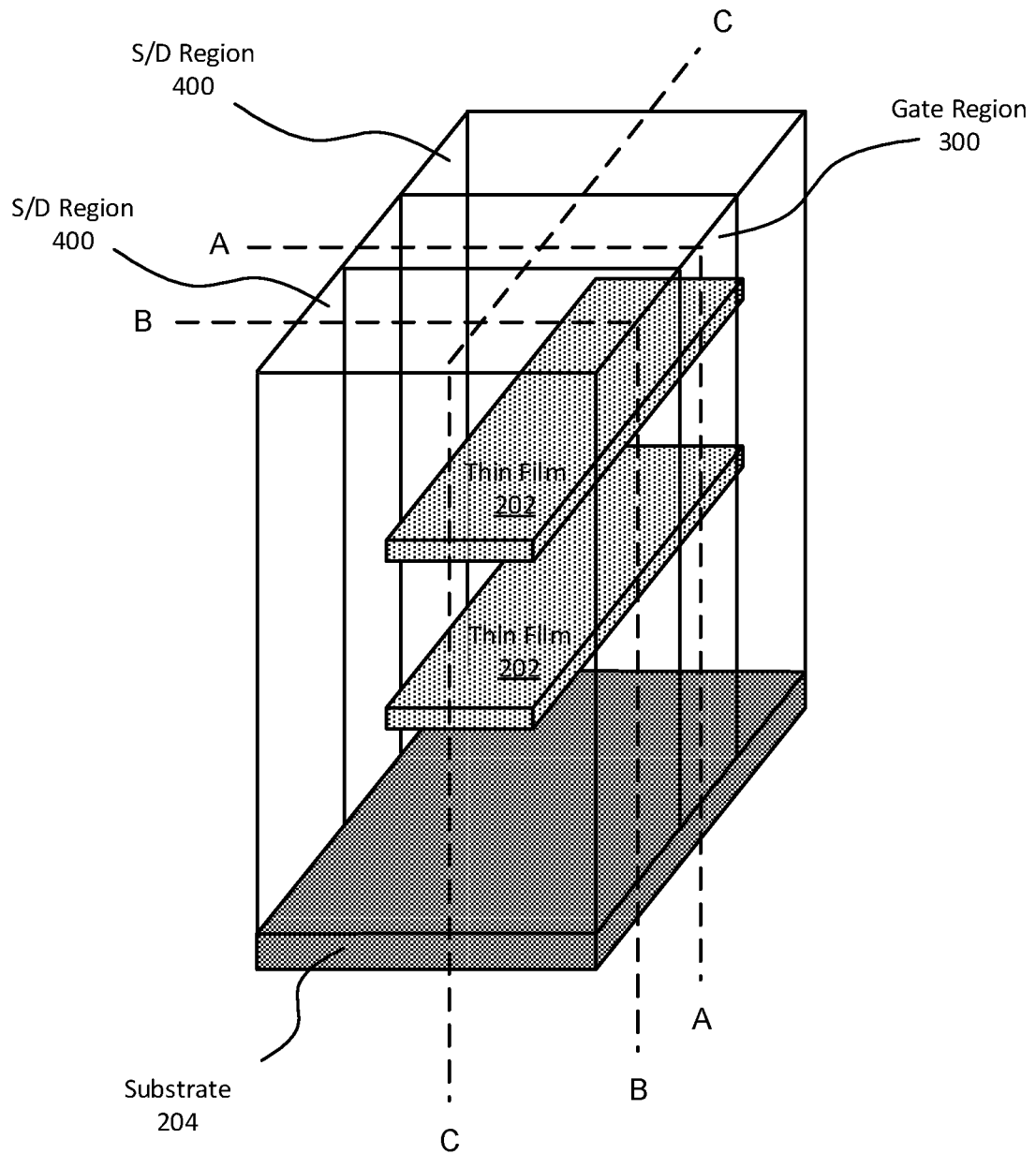
FIGS. 2-13 illustrate example IC structures that are formed when carrying out the method of FIGS. 1A and 1B, in accordance with some embodiments

Turning initially to FIG. 2, a perspective view of a stacked TFT structure is shown at a high level, in which many details are omitted for illustration clarity. These details will be shown and described in the later figures. The TFT structure in this example includes 2 thin film layers 202 above the substrate 204. The TFT is shown to be segmented into three regions, along the Z-axis. These regions include a source (or drain) region 400, a gate region 300, and a drain (or source) region 400. Cross-section A-A, through the gate region 300 in the X-Y plane, is illustrated in greater detail in FIG. 3. Cross-section B-B, through the S/D region 400 in the X-Y plane, is illustrated in greater detail in FIG. 4. Cross-section C-C, in the Y-Z plane, is illustrated in greater detail in FIG. 14.

Figure 3:
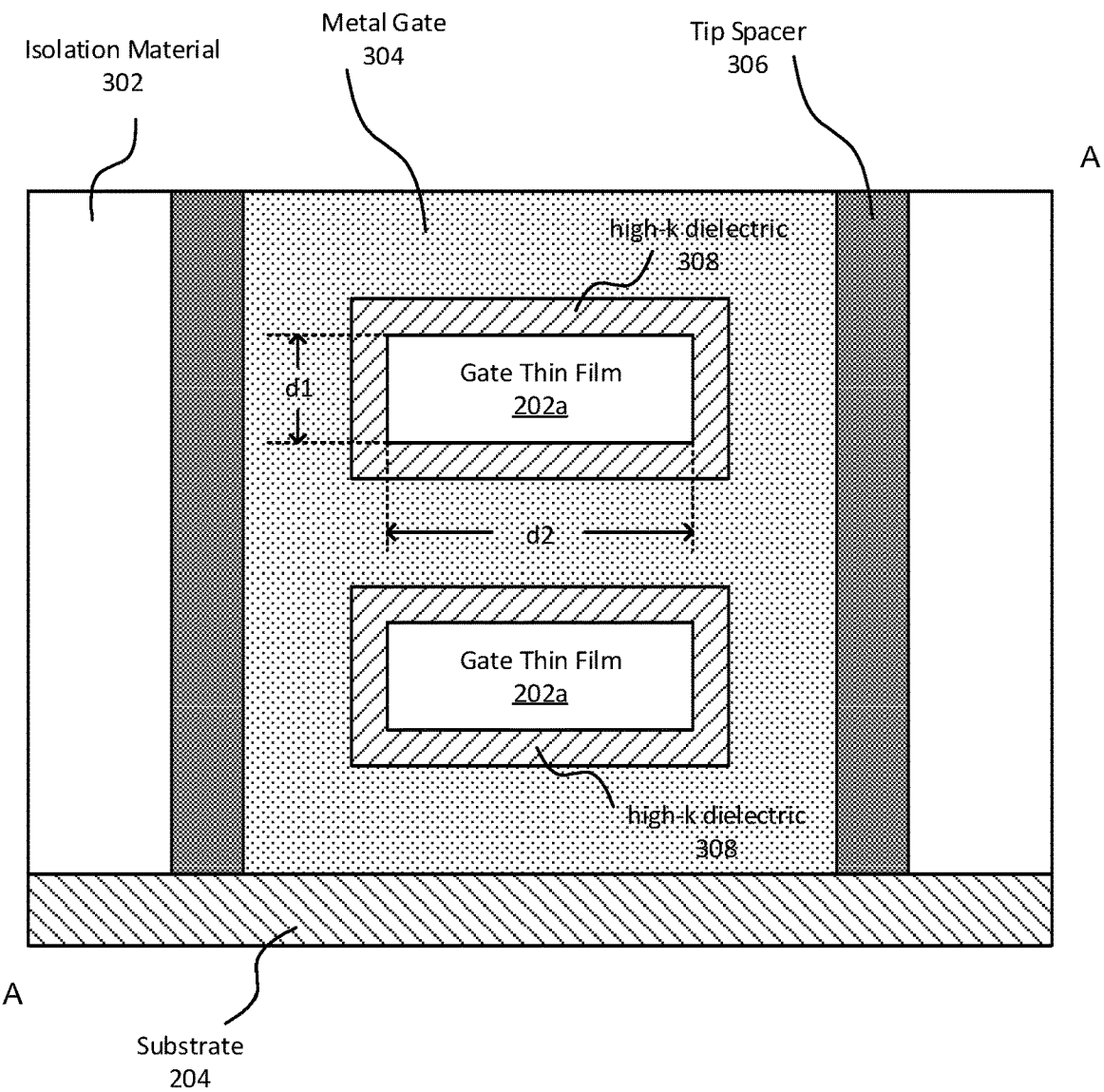

FIG. 3 illustrates an example cross-sectional view A-A of the gate region 300. Gate thin film material 202a (i.e., the section of thin film 202 in the gate region) is shown to be wrapped with a gate dielectric layer 308 on all 4 sides. In some embodiments, the cross-sectional dimensions of the gate thin film 202a may be in the range of 1-100 nm and more specifically in the range of 1-20 nm. In some embodiments, the gate thin film material may include indium gallium zinc oxide (InGaZnO, also referred to as IGZO), although other materials are possible such as, for example, zinc oxide, indium oxide, aluminum zinc oxide, gallium oxide, indium zinc oxide, indium tin oxide, copper oxide, zinc tin oxide, indium gallium arsenide, indium phosphide, silicon, germanium, and/or silicon germanium.

In some embodiments, the gate dielectric layer 308 includes a dielectric material such as silicon dioxide and/or a high-k dielectric material such as hafnium dioxide, hafnium silicon oxide, hafnium zirconium oxide, zirconium oxide, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate. In some embodiments, an annealing process may be carried out on the gate dielectric layer 308 to improve its quality when a high-k material is used. In any such embodiments, the spacing between gate thin film layers (along the Y-axis) may be in the range of 1-100 nm and more specifically in the range of 1-20 nm. The dielectric layer 308 eliminates the need for additional passivation layers between each of the stacked gate thin film layers.

Metal gate structure 304 is shown to encompass the wrapped thin film layers 202a in the gate or so-called channel area, and may serve as an electrical contact for the gate. In some embodiments, the metal gate structure, also referred to herein as a gate electrode structure, may include a wide range of suitable metals or metal alloys, such as titanium nitride (TiN) or tungsten or aluminum or titanium, or tantalum, or copper, or tantalum nitride, or a combination thereof (e.g., tungsten core with TiN on sides of core for work function). Numerous gate electrode materials and structures can be used. Tip spacers 306 are shown adjacent to the metal gate 304 and serve to help insulate the gate from the source and drain. In some embodiments, the tip spacers may include any suitable electrical insulator, dielectric, oxide (e.g., silicon oxide), and/or nitride (e.g., silicon nitride) material. Isolation material 302 is shown adjacent to the tip spacers 306 and serves to isolate this TFT from any adjacent TFTs. In some embodiments, isolation material 302 may also include any suitable electrically insulating material, such as one or more dielectric, oxide (e.g., silicon dioxide), and/or nitride (e.g., silicon nitride) materials. The gate region is disposed on an underlying substrate layer 204 which, in some embodiments, may include an insulating oxide layer, although other materials are possible as will be explained below.

In some embodiments, the structures for gate dielectric 308 and/or gate electrode 304 may include any number of discrete layers and in some cases are multilayer structures of two or more material layers. For instance, in one such embodiment, the gate dielectric 308 is a bi-layer structure having a first dielectric material (e.g., silicon dioxide) in contact with the channel region (gate thin film 202a) and a second dielectric material (e.g., hafnium oxide) in contact with the first dielectric material, the first dielectric material having a dielectric constant that is lower than the dielectric constant of the second dielectric material. Likewise, the gate electrode 304 structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric and/or gate electrode may include grading (increasing or decreasing, as the case may be) of the concentration of one or more materials therein. In a more general sense, any number of suitable gate structure configurations can be used, as will be appreciated.

Figure 4:
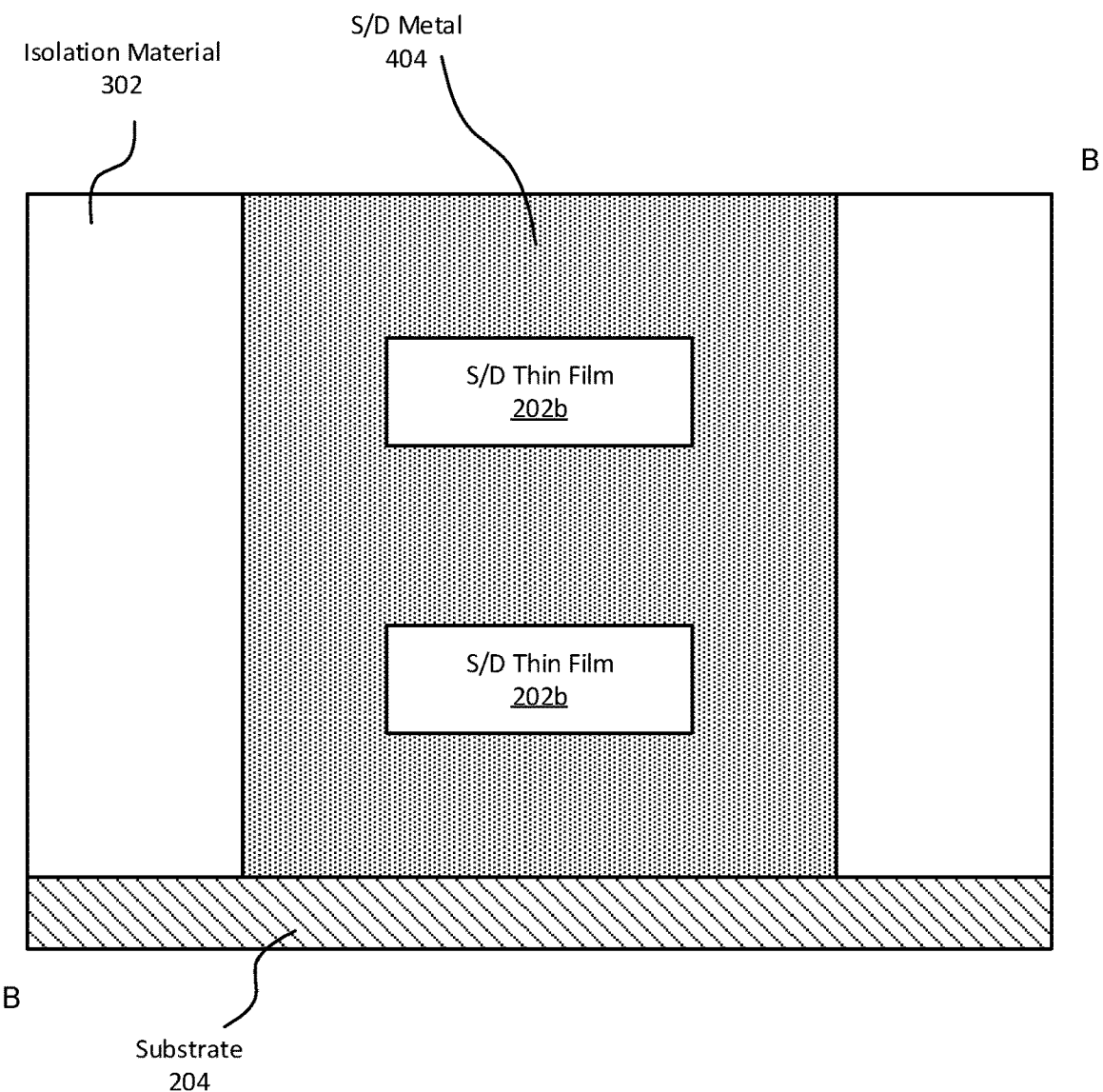
Figure 5A:
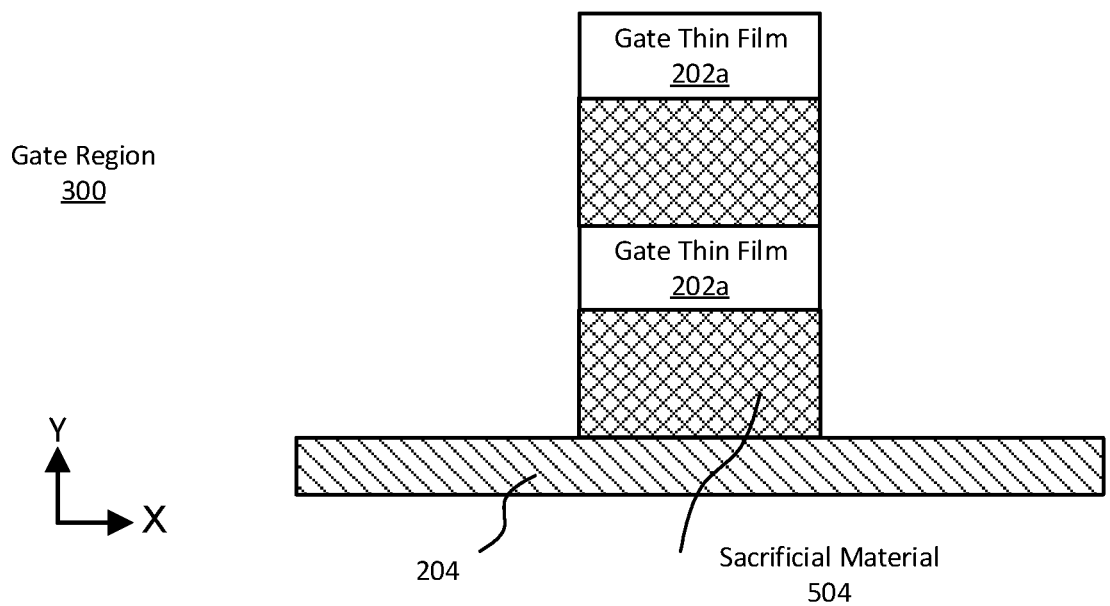
Figure 5B:
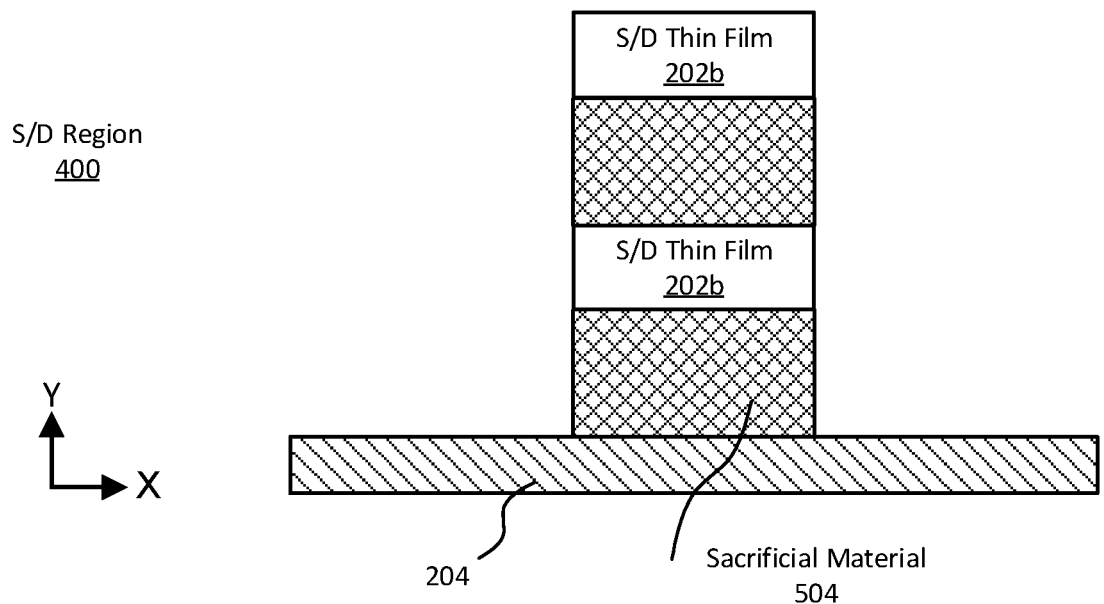

FIG. 4 illustrates an example cross-sectional view B-B of the S/D region 400. S/D thin film material 202b (i.e., the section of thin film 202 extending into the S/D region) may also include IGZO in some embodiments, although other materials are possible as will be explained below. The S/D thin film material 202b may also, however, be doped to achieve desired S/D characteristics for the TFT device. In some embodiments, the doping process may include forming oxygen vacancies in the IGZO and/or introducing impurities (e.g., n-type and/or p-type impurities).

An S/D metal structure 404 is shown to encompass the S/D thin film layers 202b, and may serve as an electrical contact for the source and drain. In some embodiments, the S/D metal structure may include titanium nitride (TiN), although other materials are possible such as, for example, titanium, tantalum nitride, cobalt, tungsten, copper nickel, tantalum, gold, gold-germanium, nickel-platinum, and/or nickel aluminum. Isolation material 302 is shown adjacent to the S/D metal 404 and serves to isolate this TFT from any adjacent TFTs. In some embodiments, isolation material 302 may include any suitable electrically insulating material, such as one or more dielectric, oxide (e.g., silicon dioxide), and/or nitride (e.g., silicon nitride) materials. The S/D region is disposed on the underlying substrate layer 204. In some embodiments, the gate thin film material 202a of the nanowire body may be thinner (e.g., along the Y-axis) than at least one of the S/D thin film layers 202b.

Referring now to FIG. 1A, method 100, for forming an integrated circuit according to an embodiment of the present disclosure, commences at operation 102 with depositing alternating layers of sacrificial material and gate thin film material (e.g., nanowires or nanoribbons) on a substrate in the gate region 300. For example (with reference to FIG. 5A, which illustrates the resulting structure in the gate region 300, in accordance with some embodiments) a first layer of sacrificial material 504 is deposited on substrate 204 followed by deposition of a first gate thin film layer 202a on top of the sacrificial material. The process is repeated with the deposition of a second sacrificial material layer and a second gate thin film layer. In some embodiments, deposition may be performed using any suitable technique, in light of the present disclosure. For example, deposition may be performed using chemical vapor deposition (CVD), atomic layer deposition (ALD), physical vapor deposition (PVD), molecular beam epitaxy (MBE), or spin-on processing. In some embodiments, the spacing (e.g., along the Y-axis) between the first and second gate thin film layers is in the range of 1 to 20 nm, and the thickness of the gate thin film layers (e.g., along the Y-axis) is also in the range of 1-20 nm.

In some embodiments, the gate thin film layers 202a may include at least one metal oxide, such as indium gallium zinc oxide (InGaZnO, also referred to as IGZO), gallium oxide, indium oxide, indium zinc oxide, indium tin oxide, copper oxide, zinc oxide, aluminum doped zinc oxide, and/or zinc tin oxide, to name a few examples. In some such embodiments, the metal oxide material (which in some cases may also be considered a semiconducting material, and more specifically, an oxide semiconductor material) may have a single crystal or monocrystalline (or simply, crystalline) structure (e.g., crystalline IGZO), an amorphous crystalline structure (e.g., amorphous IGZO), or a crystalline structure in between that may be referred to as a polycrystalline structure (e.g., polycrystalline IGZO). Further, in some such embodiments, the metal oxide material may have other type of crystalline structures, such as a C-axis aligned crystalline (CAAC) structure (e.g., CAAC IGZO) or a nanocrystalline structure (e.g., nanocrystalline IGZO). Note that these other types of crystalline structures may be well suited for production purposes because of their relatively low thermal budget requirements (that can be suitable with back-end-of-line processing, such as thermal budgets of 400-600 degrees Celsius), relatively low cost, relatively high throughput, and relatively high reliability.

In some embodiments, the gate thin film layers 202a may include amorphous, polycrystalline, or monocrystalline group IV and/or group III-V semiconductor material, such as silicon, germanium, silicon germanium, gallium arsenide, or indium gallium arsenide, to name a few examples. In some such embodiments, the group IV and/or group III-V semiconductor material, where employed may be grown at low temperatures, particularly at back-end-of-line (BEOL) IC locations. Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

Substrate 204, in some embodiments, may be: a bulk substrate including group IV semiconductor material (e.g., Si, Ge, SiGe), group III-V semiconductor material (e.g., GaAs, GaAsSb, GaAsIn), and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

Although substrate 204, in this example embodiment, is shown as having a thickness (dimension in the Y-axis direction) similar to other layers shown in subsequent structures for ease of illustration, in some instances, substrate 204 may be much thicker than the other layers, such as having a thickness in the range of 50 to 950 microns, for example, or any other suitable thickness as will be apparent in light of this disclosure. In some embodiments, substrate 204 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Further note that, while the structures shown in this and other figures, as being relatively rectangular in nature (with straight sides and a flat top) for ease of depiction, in reality, they may include a tapered or otherwise varying profile where some portions of the structure are narrower than other portions. Moreover, some portions may be rounded, rather than flat. Numerous other real-world geometries will be appreciated.

Method 100 of FIG. 1 continues with performing, at operation 104, the depositing of alternating layers of sacrificial material and S/D thin film material (e.g., nanowires or nanoribbons) on a substrate in the S/D region 400. For example (with reference to FIG. 5B, which illustrates the resulting structure in the S/D region 400, in accordance with some embodiments) a first layer of sacrificial material 504 is deposited on substrate 204 followed by deposition of a first S/D thin film layer 202b on top of the sacrificial material. The process is repeated with the deposition of a second sacrificial material layer and a second S/D thin film layer. In some embodiments, the spacing (e.g., along the Y-axis) between the first and second S/D thin film layers is in the range of 1 to 20 nm, and the thickness of the S/D thin film layers (e.g., along the Y-axis) is also in the range of 1-20 nm.

In some embodiments, the S/D thin film material 202b may be the same or similar in composition to the gate thin film material 202a, with additional processing, however, to include doping to form oxygen vacancies and/or to introduce impurities (e.g., n-type and/or p-type impurities) to achieve desired resulting S/D region characteristics for the TFT device being formed. In some such embodiments, oxygen vacancies may be formed on the surface of the S/D thin film layer 202b, such as via plasma treatment to damage the surfaces, chemical treatment to extract material from the layer (e.g., extract indium, gallium, and/or zinc from IGZO) to form a modified surface that has higher oxygen vacancies, an -idation type of treatment (e.g., silicidation or III-V-idation type of reaction) to strip the S/D surfaces of oxygen and leave vacancies, and/or any other suitable processing as can be understood based on this disclosure.

In some embodiments, the S/D thin film material 202b may include indium tin oxide. In some embodiments, the S/D thin film material 202b may include titanium, titanium nitride, or tantalum nitride, each in combination with a more conductive material such as cobalt, tungsten, or copper. In some embodiments, the S/D thin film material 202b may include indium arsenic applied through epitaxial deposition.

Figure 6A:
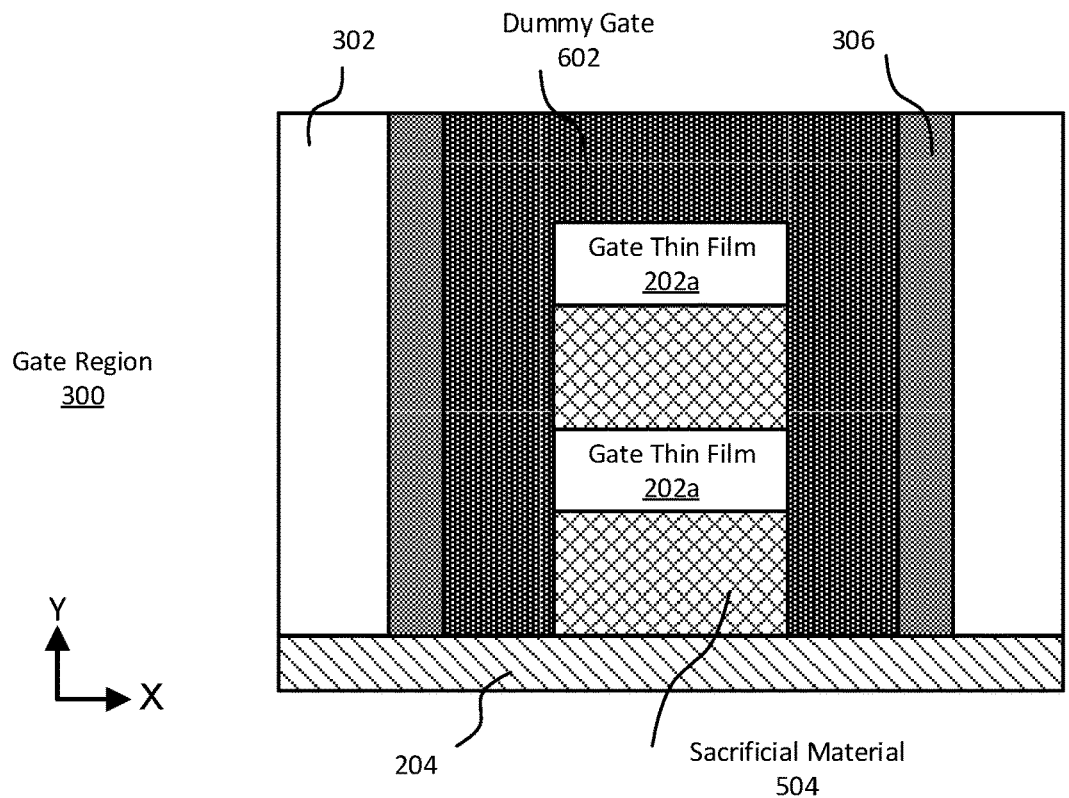

Method 100 of FIG. 1 continues with the formation, at operation 106, of dummy gate material 602, tip spacer 306, and isolation material 302 over the gate region 300, resulting in the structure illustrated in FIG. 6A, in accordance with some embodiments. Operation 106 may comprise individual sub operations such as, for example: depositing the dummy gate material 602; etching that material back and depositing material for the tip spacer 306 adjacent to the dummy gate, and then depositing the isolation material 302 adjacent to the tip spacer.

In some embodiments, tip spacers 306 may include any suitable material, such as any suitable electrical insulator, dielectric, oxide (e.g., silicon oxide), and/or nitride (e.g., silicon nitride) material, as will be apparent in light of this disclosure.

In some embodiments, isolation material 302 may include any suitable electrically insulating material, such as one or more dielectric, oxide (e.g., silicon dioxide), and/or nitride (e.g., silicon nitride) materials. In some embodiments, the isolation material 302 may be selected based on the material of substrate 204. For instance, in the case of a Si substrate, the isolation material may be selected to be silicon dioxide or silicon nitride, to provide some examples.

Etching may be performed using any suitable process including wet/dry etching, selective/non-selective etching, and/or lithography. Etching may further include masking operations to help prevent the etching from consuming material in an undesired manner or from removing selected regions that are to be protected.

Figure 6B:
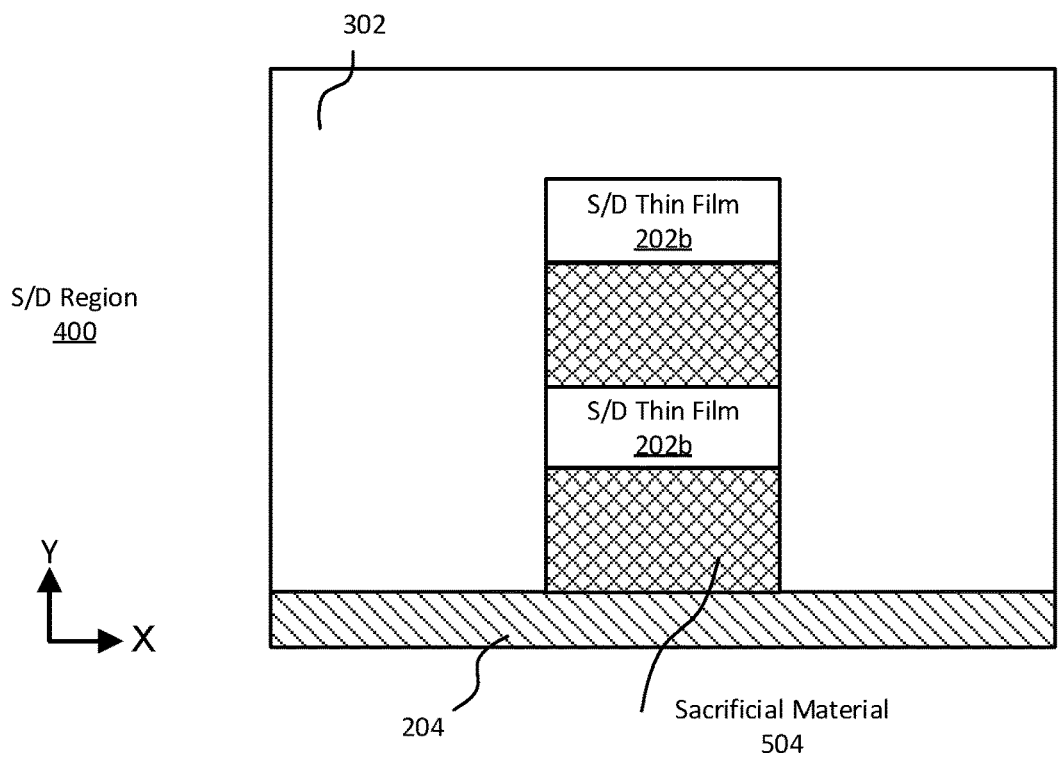

Method 100 of FIG. 1 continues with the deposition, at operation 108, of isolation material 302 over the S/D region 400, resulting in the structure illustrated in FIG. 6B, in accordance with some embodiments.

Figure 7:
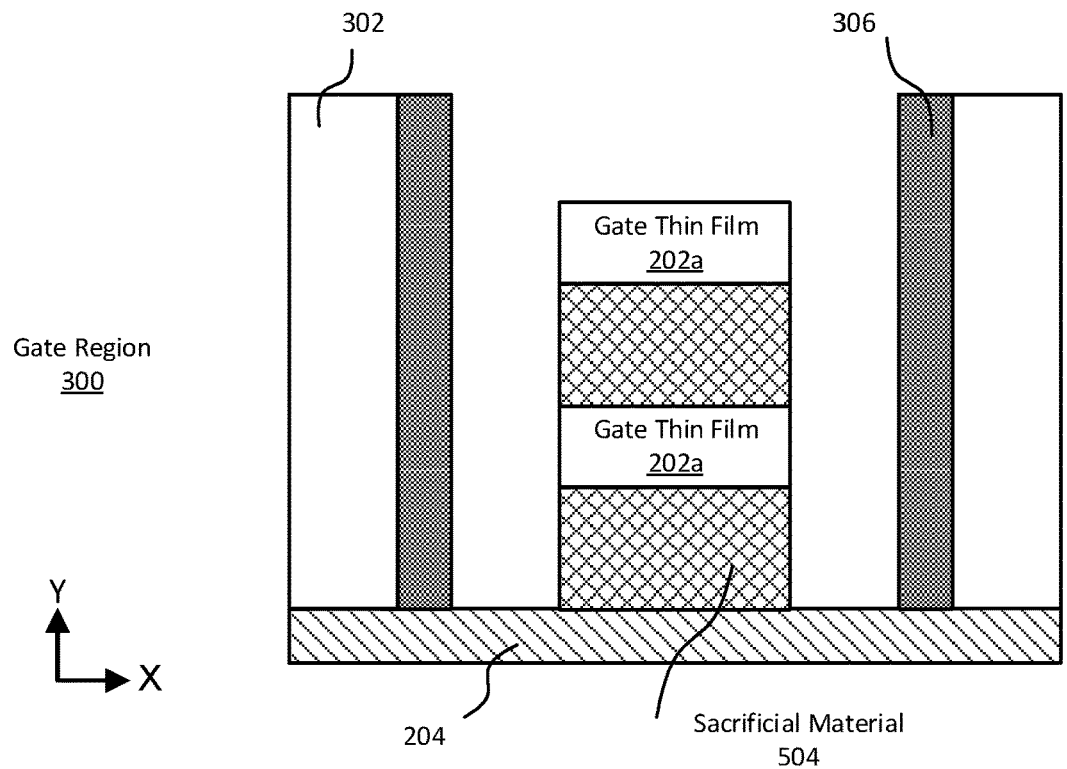
Figure 8:
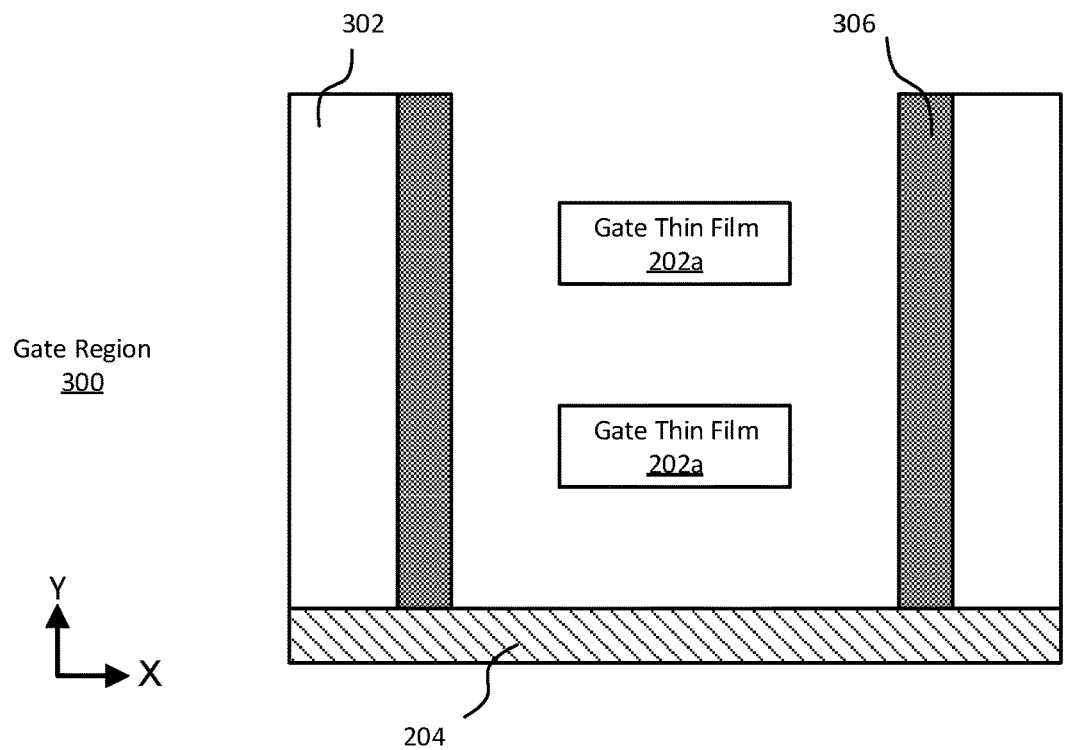

Method 100 of FIG. 1 continues, at operation 110, with removal of the dummy gate material 602 from the gate region 300, resulting in the structure illustrated in FIG. 7, and removal of the sacrificial material 504 from the gate region 300, resulting in the structure illustrated in FIG. 8, in accordance with some embodiments. At this stage in the process flow, after removal of the sacrificial material, the gate thin film structures 202a are supported by the extension of the thin film into the S/D regions (S/D thin film 202b) and the isolation material 302 of the S/D region. The removal of dummy gate material 602 and sacrificial material 504 may be accomplished, for example, through an etching process.

Figure 9:
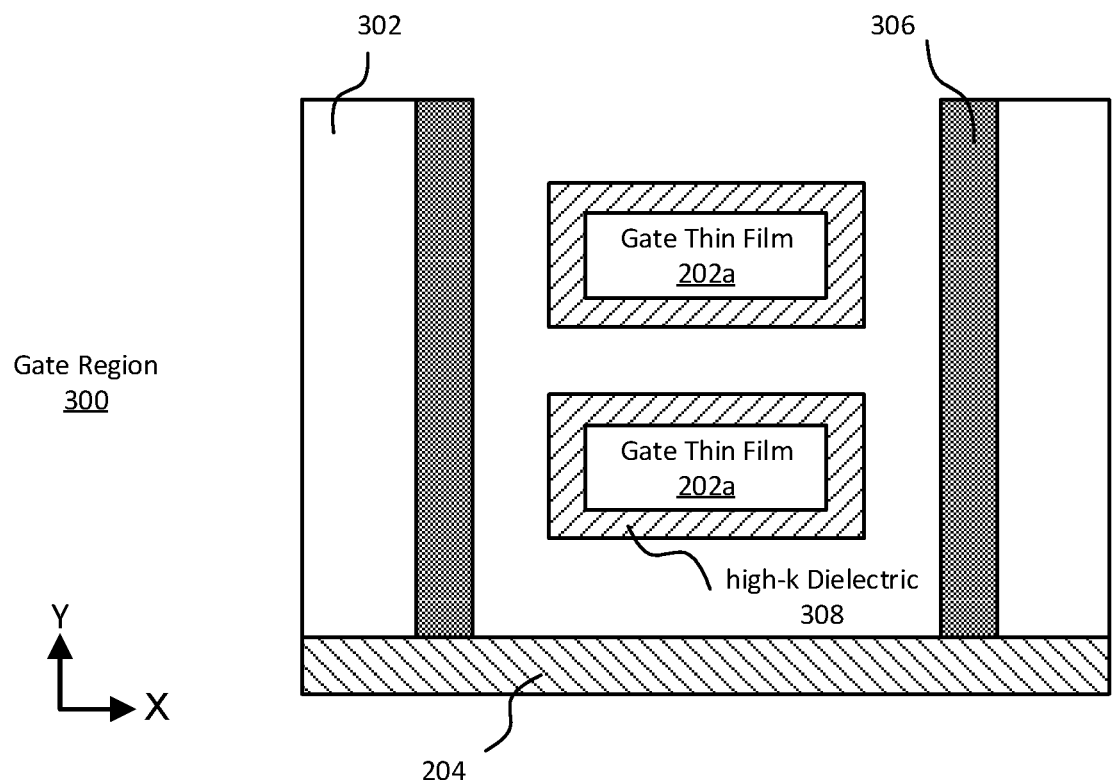

Method 100 of FIG. 1 continues, at operation 112, with the deposition of a high-k dielectric material 308 around the gate thin film 202a, resulting in the structure illustrated in FIG. 9, in accordance with some embodiments. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 1B:
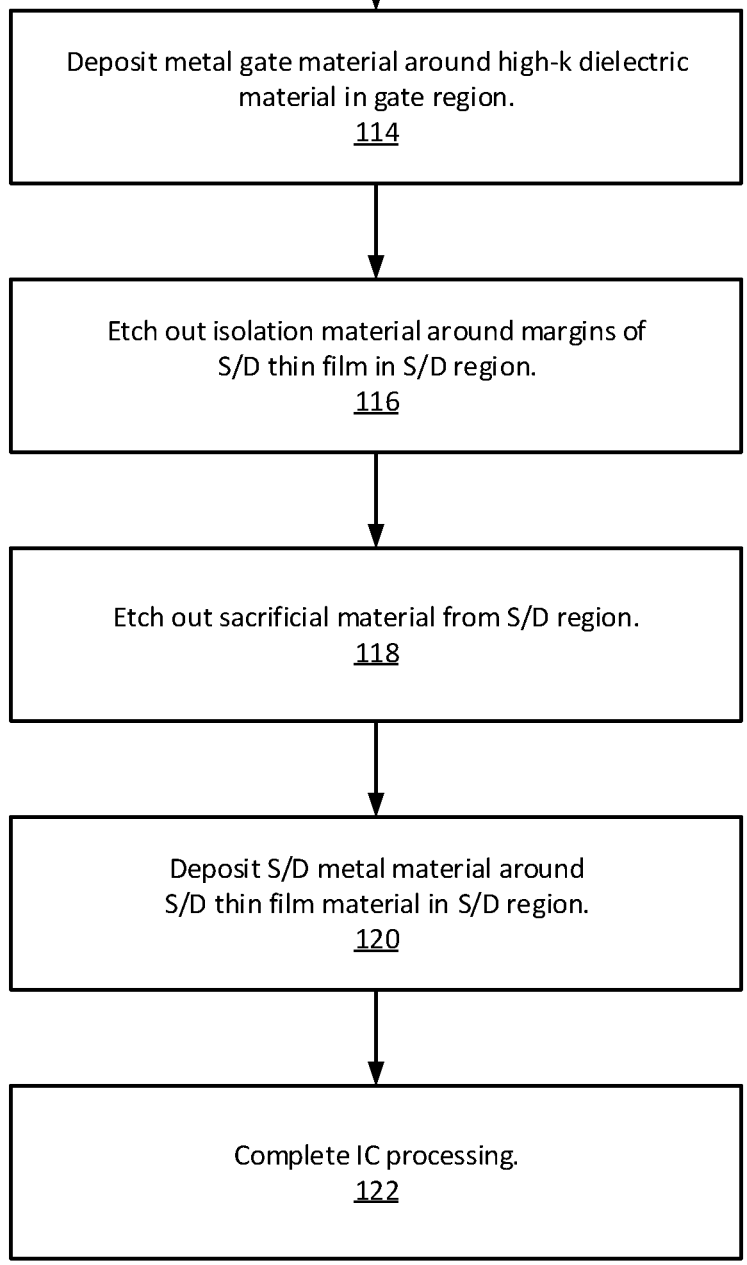
Figure 10:
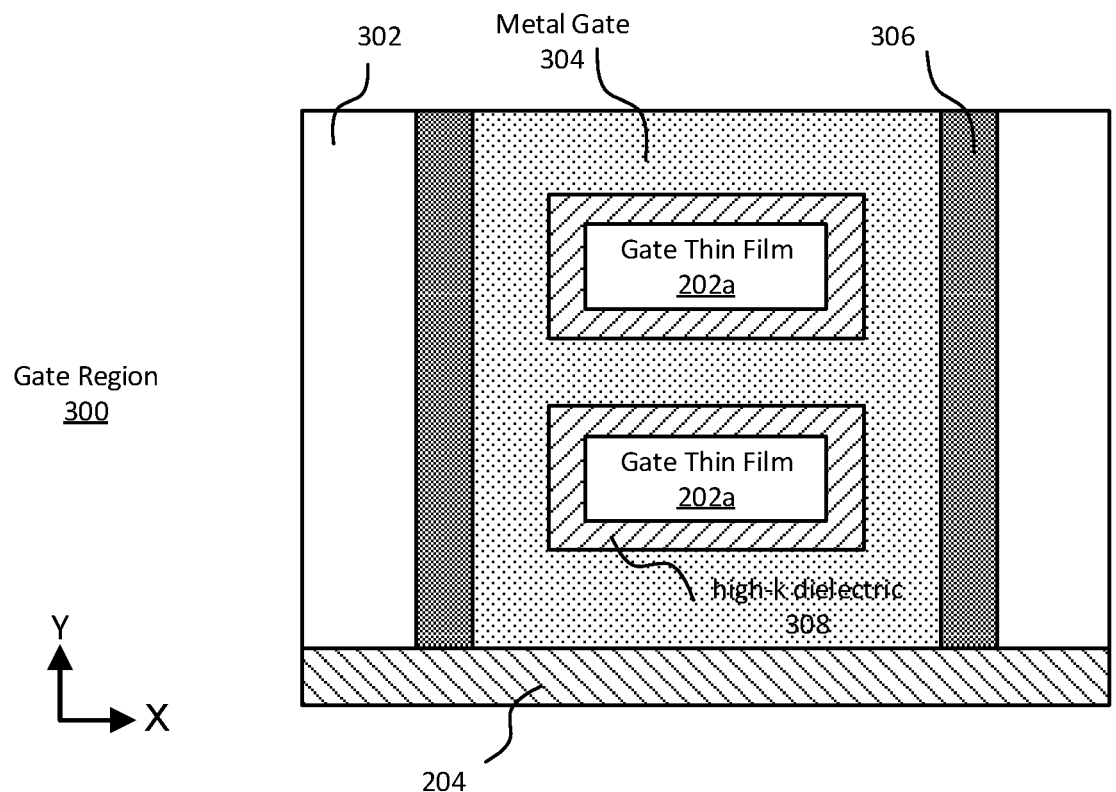
Figure 11:
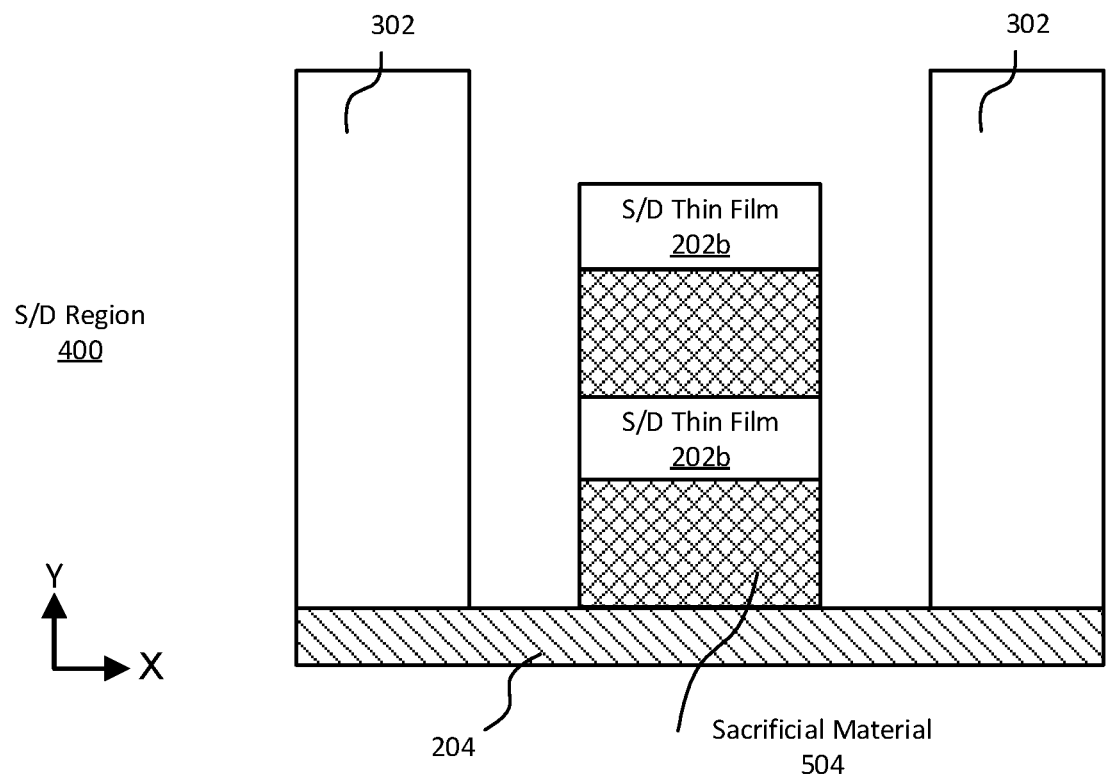

Method 100 of FIG. 1 (referring now to FIG. 1B) continues, at operation 114, with the deposition of metal gate material 304 around the high-k material 308, resulting in the structure illustrated in FIG. 10, in accordance with some embodiments. The metal gate material 304 serves as an electrical contact to the gate. In some embodiments, the metal gate material 304 may include titanium nitride or other suitable electrically conductive material. At this stage, a planarization and/or polishing operation may be performed over the top of the gate region using any suitable techniques such as chemical-mechanical planarization/polishing (CMP) processes, for example.

Method 100 of FIG. 1 continues, at operation 116, with etching out of a portion of the isolation material 302 from the S/D region 400. The portion to be etched is adjacent to, and on top of, the S/D thin film layers 202b. The removal of this portion results in the structure illustrated in FIG. 11, in accordance with some embodiments.

Figure 12:
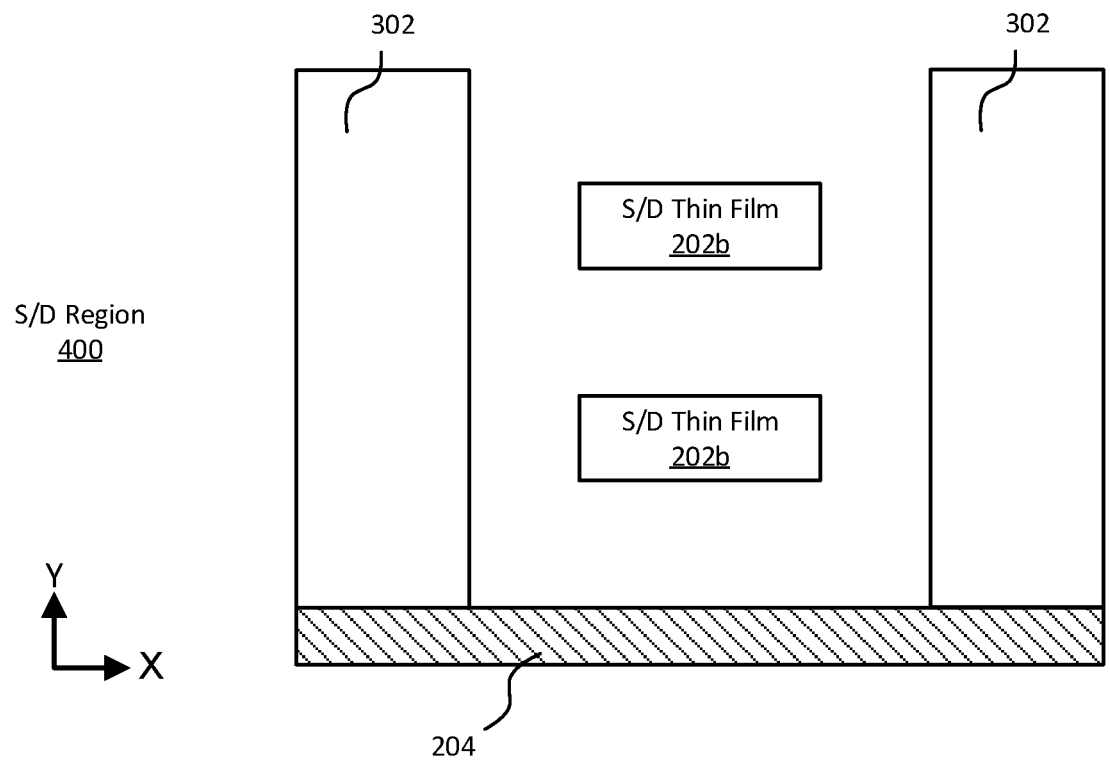

Method 100 of FIG. 1 continues, at operation 118, with etching out of the sacrificial material 504 from the S/D region, resulting in the structure illustrated in FIG. 12, in accordance with some embodiments. At this stage in the process flow, after removal of the sacrificial material, the S/D thin film structures 202b are supported by the extension of the thin film into the gate region (gate thin film 202a) and the isolation material 302 of the gate region.

Figure 13:
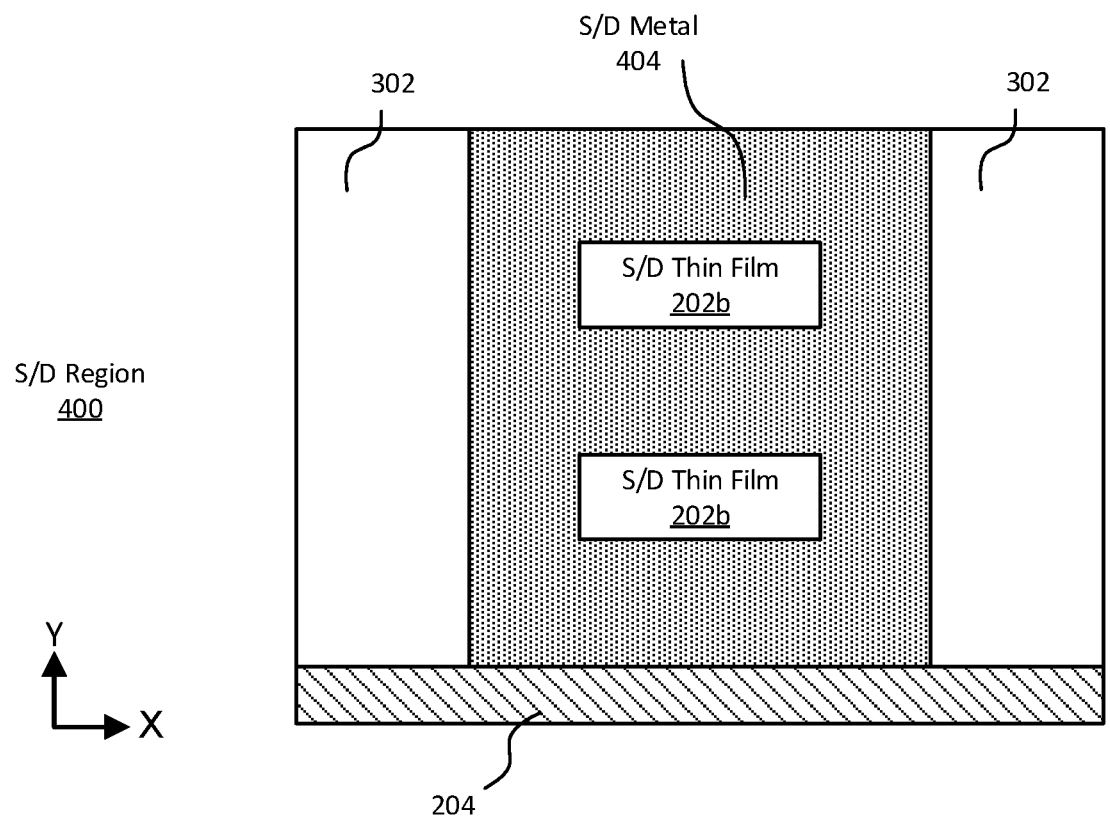

Method 100 of FIG. 1 continues, at operation 120, with the deposition of S/D metal material 404 around the S/D thin film material 202b in the S/D region 400, resulting in the structure illustrated in FIG. 13, in accordance with some embodiments. The S/D metal material 404 serves as an electrical contact to the source and drains. In some embodiments, the S/D metal material 404 may include titanium nitride or other suitable electrically conductive material. At this stage, a planarization and/or polishing operation may be performed over the top of the S/D region using any suitable techniques such as CMP, for example.

Method 100 of FIG. 1 continues, at operation 122, with completing integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. For example, a metallization layer may be formed between the bottom most thin film transistor of the stack and the substrate. Any other suitable processing may be performed, as will be apparent in light of this disclosure. Note that the processes 102-122 of method 100 are shown in a particular order for ease of description. However, one or more of the processes 102-122 may be performed in a different order or may not be performed at all. For example, in some embodiments, the S/D region 400 may be formed before the gate region 300. Recall that the techniques may be used to form a multitude of different transistor types and configurations. Numerous variations and configurations will be apparent in light of the present disclosure.

Figure 14:
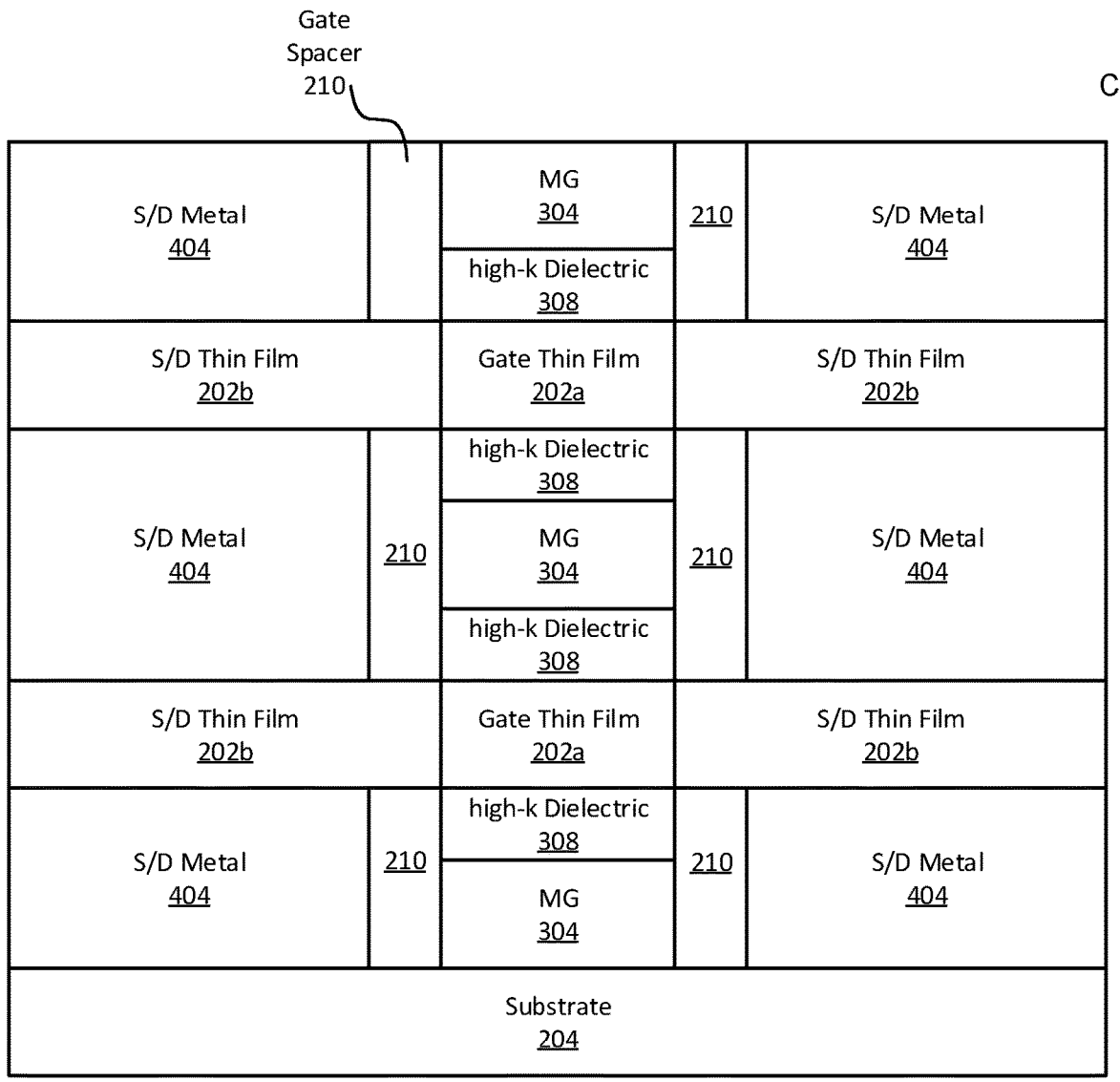
FIG. 14 illustrates an example cross-sectional view along the plane C-C in FIG. 2, in accordance with some embodiments.
Figure 14:
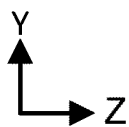

FIG. 14 illustrates an example cross-sectional view along the plane C-C in FIG. 2, in accordance with some embodiments. The cross-sectional view of FIG. 14 is provided to assist in illustrating different features of the structure of FIG. 2 in conjunction with the details shown in FIG. 3 for the gate region and FIG. 4 for the S/D regions. Therefore, the relevant description with respect to each similarly numbered feature in FIGS. 2-4 is equally applicable to FIG. 14. However, note that the dimensions of the features shown in FIG. 14 may differ relative to the features in FIGS. 2-4, for ease of illustration.

For each of the two TFT layers, the gate thin film structure 202a is shown to be surrounded on top and bottom (through the cross-section) by the high-k layer 308, which in turn is surrounded on top and bottom by the metal gate layer 304. Shown to the left and right of the gate thin film structure 202a are the source and drain thin film structures 202b. Shown above and below the S/D thin film structures 202b are the S/D metal layers 404. Gate spacers 210 are also shown to separate the S/D metal layers 404 from the adjacent metal gate layers 304 to prevent electrical shorting.

Spacers 210 may include any suitable material, such as any suitable electrical insulator, dielectric, oxide (e.g., silicon oxide), and/or nitride (e.g., silicon nitride) material, as will be apparent in light of this disclosure.

In some embodiments, the length of the gate thin film structure, or nanowire body, 202a (e.g., along the Z-axis from the source region to the drain region) may be in the range of 5 nm to 100 nm. In some embodiments, the thickness of the thin film structures, or nanowire bodies, 202a and 202b, may be in the range of 1 nm to 20 nm (e.g., along the Y-axis). In some embodiments, the spacing between the thin film structures, or nanowire bodies, 202a and 202b, may be in the range of 1 nm to 20 nm (e.g., along the Y-axis).

In some embodiments, the techniques enable maintaining a desired device performance when scaling to such low thresholds, such as sub-50, sub-40, sub-30, or sub-20 nm thresholds and beyond, as can be understood based on this disclosure. For instance, the techniques as variously described herein can reduce short channel effects to provide improved gate control to enable faster switching speeds, and improved conduction to allow for increased current handling capacity.

Example System

Figure 15:
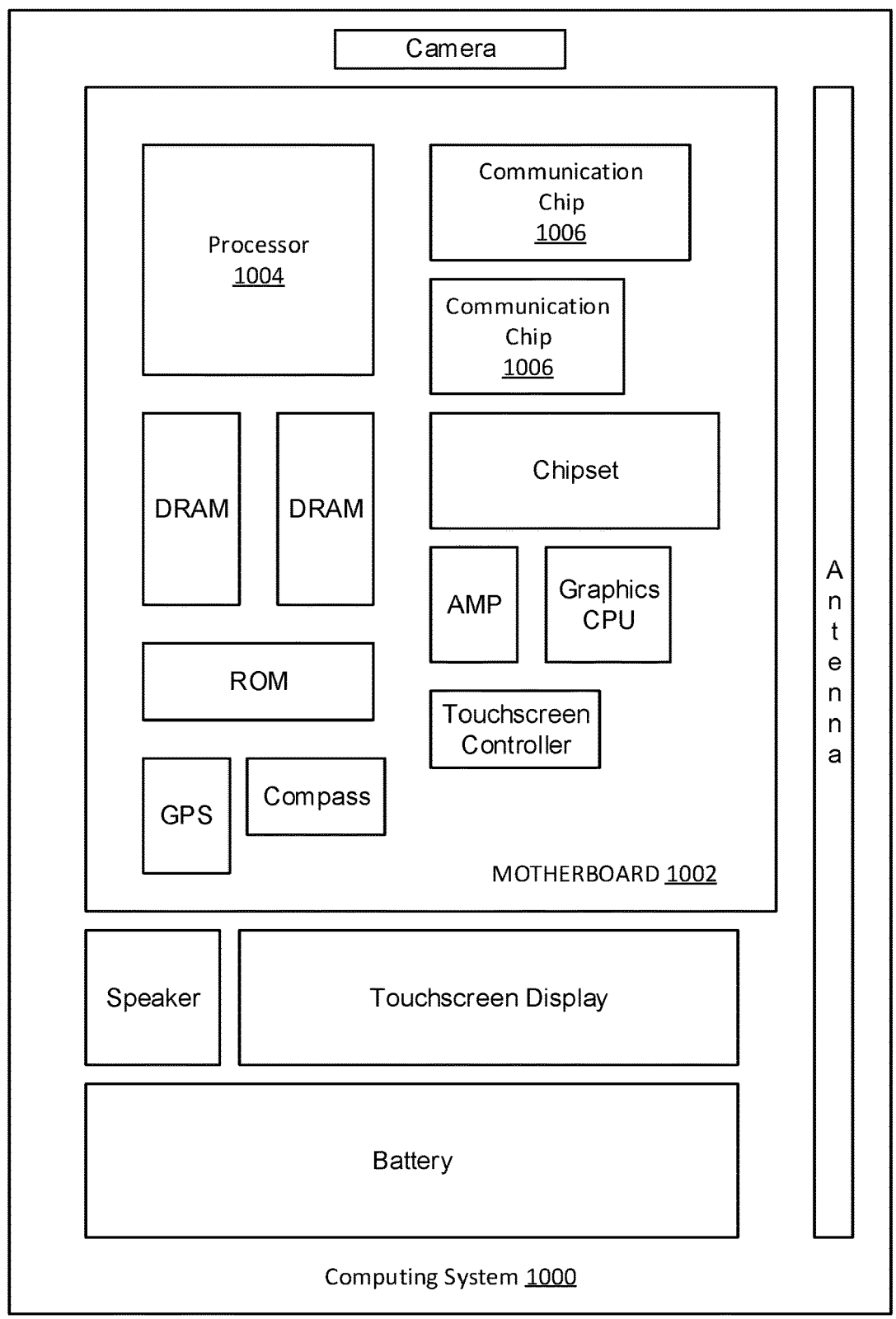
FIG. 15 illustrates a computing system implemented with integrated circuit structures and/or transistor devices formed using the techniques disclosed herein, in accordance with some embodiments of the present disclosure.

FIG. 15 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) comprising: a nanowire body including an oxide semiconductor material including first, second, and third portions, the second portion between the first and third portions, the first portion being a source region and the third portion being a drain region; a gate dielectric structure disposed around the second portion of the nanowire body; and a gate electrode structure disposed around the gate dielectric structure, the gate electrode structure comprising metal.

Example 2 includes the subject matter of Example 1, further comprising one or more additional nanowire bodies stacked within the gate electrode structure and the gate dielectric structure disposed around the additional nanowire bodies.

Example 3 includes the subject matter of Examples 1 or 2, wherein the nanowire body and the one or more additional nanowire bodies are spaced apart from each other by a distance in the range of 1 nanometer to 20 nanometers.

Example 4 includes the subject matter of any of Examples 1-3, wherein the number of additional nanowire bodies is in the range of 1 to 10.

Example 5 includes the subject matter of any of Examples 1-4, wherein the gate dielectric structure comprises a high-k dielectric material including hafnium dioxide (HfO2).

Example 6 includes the subject matter of any of Examples 1-5, wherein the gate dielectric structure comprises a high-k dielectric material including at least one of hafnium zirconium oxide, zirconium oxide, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 7 includes the subject matter of any of Examples 1-6, wherein the oxide semiconductor material includes indium, gallium, zinc, and oxygen.

Example 8 includes the subject matter of any of Examples 1-7, wherein the oxide semiconductor material includes at least one of zinc oxide, indium oxide, aluminum zinc oxide, gallium oxide, indium zinc oxide, indium tin oxide, copper oxide, zinc tin oxide, indium gallium arsenide, indium phosphide, silicon, germanium, and silicon germanium.

Example 9 includes the subject matter of any of Examples 1-8, wherein the gate electrode structure includes titanium and nitrogen.

Example 10 includes the subject matter of any of Examples 1-9, wherein the gate dielectric structure comprises a high-k dielectric material, and the gate electrode structure includes at least one of titanium nitride, cobalt, tungsten, copper nickel, tantalum, gold, gold-germanium, nickel-platinum, and nickel aluminum.

Example 11 includes the subject matter of any of Examples 1-10, wherein the second portion of the nanowire body is thinner than at least one of the source region and the drain region.

Example 12 includes the subject matter of any of Examples 1-11, wherein at least one of the first and third portions of the nanowire body includes a higher concentration of oxygen vacancies in the oxide semiconductor material.

Example 13 includes the subject matter of any of Examples 1-12, further comprising at least one of a first contact structure disposed around the first portion of the nanowire body and a second contact structure disposed around the third portion of the nanowire body, the first and second contact structures comprising metal.

Example 14 includes the subject matter of any of Examples 1-13, further comprising at least one of a first gate spacer between the gate electrode structure and the first metal structure and a second gate spacer between the gate electrode structure and the second metal structure.

Example 15 includes the subject matter of any of Examples 1-14, wherein the thickness of the nanowire body is in the range of 1 nanometer to 20 nanometers.

Example 16 includes the subject matter of any of Examples 1-15, wherein the length of the nanowire body from the source region to the drain region is in the range of 5 nanometers to 100 nanometers, as measured from respective outermost portions of the source and drain regions.

Example 17 includes the subject matter of any of Examples 1-16, further comprising an underlying semiconductor substrate.

Example 18 includes the subject matter of any of Examples 1-17, wherein the underlying semiconductor substrate includes an insulating oxide layer.

Example 19 includes the subject matter of any of Examples 1-18, further comprising at least one interconnect layer between the nanowire body and the underlying semiconductor substrate, the interconnect layer including one or more metal features in an insulator material.

Example 20 is a computing system comprising the IC of any of Examples 1-19.

Example 21 is a method of forming an integrated circuit (IC), the method comprising: forming a nanowire body including an oxide semiconductor material, the nanowire body have first, second, and third portions, the second portion being between the first and third portions; forming a gate dielectric structure disposed around the second portion of the nanowire body; forming a gate electrode structure disposed around the gate dielectric structure; forming a source region in the first portion of the nanowire body and a drain region in the third portion of the nanowire body.

Example 22 includes the subject matter of Example 21, further comprising forming one or more additional nanowire bodies and forming the gate dielectric structure disposed around the one or more additional nanowire bodies.

Example 23 includes the subject matter of Examples 21 or 22, wherein the nanowire body and the one or more additional nanowire bodies are spaced apart from each other by a distance in the range of 1 nanometer to 20 nanometers, and the number of additional nanowire bodies is in the range of 1 to 10.

Example 24 includes the subject matter of any of Examples 21-23, wherein the gate dielectric structure comprises a high-k dielectric material including hafnium dioxide (HfO2).

Example 25 includes the subject matter of any of Examples 21-24, wherein the gate dielectric structure comprises a high-k dielectric material including at least one of hafnium zirconium oxide, zirconium oxide, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 26 includes the subject matter of any of Examples 21-25, wherein the oxide semiconductor material includes indium, gallium, zinc, and oxygen.

Example 27 includes the subject matter of any of Examples 21-26, wherein the oxide semiconductor material includes at least one of zinc oxide, indium oxide, aluminum zinc oxide, gallium oxide, indium zinc oxide, indium tin oxide, copper oxide, zinc tin oxide, indium gallium arsenide, indium phosphide, silicon, germanium, and silicon germanium.

Example 28 includes the subject matter of any of Examples 21-27, wherein the second portion of the nanowire body is thinner than at least one of the source region and the drain region.

Example 29 includes the subject matter of any of Examples 21-28, wherein the thickness of the nanowire body is in the range of 1 nanometer to 20 nanometers.

Example 30 includes the subject matter of any of Examples 21-29, wherein the gate electrode structure includes titanium and nitrogen.

Example 31 includes the subject matter of any of Examples 21-30, wherein the gate dielectric structure comprises a high-k dielectric material, and the gate electrode structure includes at least one of titanium nitride, cobalt, tungsten, copper nickel, tantalum, gold, gold-germanium, nickel-platinum, and nickel aluminum.

Example 32 includes the subject matter of any of Examples 21-31, wherein at least one of the first and third portions of the nanowire body includes a higher concentration of oxygen vacancies in the oxide semiconductor material.

Example 33 includes the subject matter of any of Examples 21-32, further comprising forming at least one of a first contact structure disposed around the first portion of the nanowire body and a second contact structure disposed around the third portion of the nanowire body, the first and second contact structures comprising metal.

Example 34 includes the subject matter of any of Examples 21-33, further comprising forming at least one of a first gate spacer between the gate electrode structure and the first metal structure and a second gate spacer between the gate electrode structure and the second metal structure.

Example 35 includes the subject matter of any of Examples 21-34, wherein the length of the nanowire body from the source region to the drain region is in the range of 5 nanometers to 100 nanometers, as measured from respective outermost portions of the source and drain regions.

Example 36 includes the subject matter of any of Examples 21-35, further comprising forming an underlying semiconductor substrate.

Example 37 includes the subject matter of any of Examples 21-36, wherein the underlying semiconductor substrate includes an insulating oxide layer.

Example 38 includes the subject matter of any of Examples 21-37, further comprising forming at least one interconnect layer between the nanowire body and the underlying semiconductor substrate, the interconnect layer including one or more metal features in an insulator material.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An integrated circuit (IC) comprising:
a body including an oxide semiconductor material including first, second, and third portions, the second portion between the first and third portions, the first portion being a source region and the third portion being a drain region, and the second portion having a cross-section with a maximum lateral width greater than a maximum vertical height;
a gate dielectric structure wrapped around the second portion of the body; and
a gate electrode structure wrapped around the gate dielectric structure, the gate electrode structure comprising metal.

2. The IC of claim 1, further comprising one or more additional bodies, the gate dielectric structure wrapped around the additional bodies.

3. The IC of claim 2, wherein the body and the one or more additional bodies are spaced apart from each other by a distance in the range of 1 nanometer to 20 nanometers.

4. The IC of claim 2, wherein the number of additional bodies is in the range of 1 to 10.

5. The IC of claim 1, wherein the gate dielectric structure comprises a high-k dielectric material including hafnium.

6. The IC of claim 1, wherein the oxide semiconductor material includes indium, gallium, zinc, and oxygen.

7. The IC of claim 1, wherein the oxide semiconductor material includes at least one of zinc oxide, indium oxide, aluminum zinc oxide, gallium oxide, indium zinc oxide, indium tin oxide, copper oxide, and zinc tin oxide.

8. The IC of claim 1, wherein the gate electrode structure includes titanium and nitrogen.

9. The IC of claim 1, wherein the second portion of the body is thinner than at least one of the source region and the drain region.

10. The IC of claim 1, wherein at least one of the first and third portions of the body includes a higher concentration of oxygen vacancies in the oxide semiconductor material, relative to the second portion.

11. The IC of claim 1, further comprising a first contact structure wrapped around the first portion of the body, and a second contact structure wrapped around the third portion of the body, the first and second contact structures comprising metal.

12. The IC of claim 11, further comprising at least one of a first gate spacer between the gate electrode structure and the first contact structure and a second gate spacer between the gate electrode structure and the second contact structure.

13. The IC of claim 1, wherein:
a thickness of the body in a vertical direction is in a range of 1 nanometer to 20 nanometers; and
a length of the body in a horizontal direction from the source region to the drain region is in the range of 5 nanometers to 100 nanometers, as measured from respective outermost portions of the source and drain regions.

14. A computing system comprising the IC of claim 1.

15. An integrated circuit (IC) comprising:
a first body of oxide semiconductor material, the first body including first, second, and third portions, the second portion of the first body between the first and third portions of the first body, the first portion of the first body being a first source region and the third portion of the first body being a first drain region, and the second portion of the first body having a cross-section with a maximum lateral width greater than a maximum vertical height;
a second body of oxide semiconductor material, the second body including first, second, and third portions, the second portion of the second body between the first and third portions of the second body, the first portion of the second body being a second source region and the third portion of the second body being a second drain region, the second portion of the second body having a cross-section with a maximum lateral width greater than a maximum vertical height, and the second body being below the first body; and
a gate structure that wraps around the second portions of the first and second bodies.

16. The IC of claim 15, wherein the gate structure comprises:
a gate dielectric that includes a high-k dielectric material including hafnium; and
a gate electrode that includes titanium and nitrogen.

17. The IC of claim 15, wherein the oxide semiconductor material includes oxygen and one or more of indium, gallium, zinc, aluminum, tin, copper, arsenic, phosphorus, silicon, and germanium.

18. The IC of claim 15, wherein the gate structure comprises:
a gate dielectric that includes a high-k dielectric material; and
a gate electrode.

19. The IC of claim 15, wherein at least one of the first and third portions of the first body or the second body includes a higher concentration of oxygen vacancies in the oxide semiconductor material, relative to the second portion.

20. An integrated circuit (IC) comprising:
a first body of oxide semiconductor material, the first body including first, second, and third portions, the second portion of the first body between the first and third portions of the first body, the first portion of the first body being a first source region and the third portion of the first body being a first drain region, and the second portion having a cross-section with a maximum lateral width greater than a maximum vertical height;
a second body of oxide semiconductor material, the second body including first, second, and third portions, the second portion of the second body between the first and third portions of the second body, the first portion of the second body being a second source region and the third portion of the second body being a second drain region, the second body being below the first body;
a gate structure that wraps around the second portions of the first and second bodies;
a first contact structure that wraps around the first portions of the first and second bodies; and
a second contact structure that wraps around the third portions of the first and second bodies, the first and second contact structures comprising metal.

* * * * *